United States Patent
Koshimizu et al.

(10) Patent No.: US 9,459,159 B2
(45) Date of Patent: Oct. 4, 2016

(54) HEAT-FLUX MEASURING METHOD, SUBSTRATE PROCESSING SYSTEM, AND HEAT-FLUX MEASURING MEMBER

(71) Applicant: TOKYO ELECTRON LIMITED, Tokyo (JP)

(72) Inventors: Chishio Koshimizu, Yamanashi (JP); Tatsuo Matsudo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/580,460

(22) Filed: Dec. 23, 2014

(65) Prior Publication Data

US 2015/0185092 A1   Jul. 2, 2015

(30) Foreign Application Priority Data

Dec. 26, 2013 (JP) ................. 2013-268968

(51) Int. Cl.
| | | |
|---|---|---|
| G01K 17/20 | (2006.01) | |
| H05H 1/24 | (2006.01) | |
| H05H 1/00 | (2006.01) | |
| H01J 37/32 | (2006.01) | |
| G01J 5/58 | (2006.01) | |

(52) U.S. Cl.
CPC ......... *G01K 17/20* (2013.01); *H01J 37/32724* (2013.01); *H01J 37/32917* (2013.01); *H01J 37/32935* (2013.01); *H05H 1/0043* (2013.01); *H05H 1/24* (2013.01); *G01J 2005/583* (2013.01)

(58) Field of Classification Search
CPC ....... G01K 17/20; G01N 21/171; G01J 9/02; H01J 37/32935; H01J 37/32917; H01J 37/32724; H05H 1/0043; H05H 1/24

USPC ............................................ 374/29
See application file for complete search history.

(56) References Cited

U.S. PATENT DOCUMENTS

| | | | | |
|---|---|---|---|---|
| 5,313,264 A | * | 5/1994 | Ivarsson ............ | G01N 21/552 250/458.1 |
| 5,450,205 A | * | 9/1995 | Sawin ............... | H01J 37/32935 216/60 |
| 5,748,317 A | * | 5/1998 | Maris ................. | G01N 21/171 356/502 |
| 2002/0180991 A1 | * | 12/2002 | Takoudis ........... | G01N 21/3563 356/630 |
| 2005/0207705 A1 | * | 9/2005 | Laurent-Lund ..... | G02B 6/125 385/45 |
| 2009/0074027 A1 | * | 3/2009 | Langley ............ | G01K 17/003 374/29 |

FOREIGN PATENT DOCUMENTS

| | | |
|---|---|---|
| JP | 2010-232527 A | 10/2010 |
| JP | 2011-14579 A | 1/2011 |

* cited by examiner

*Primary Examiner* — Lisa Caputo
*Assistant Examiner* — Philip Cotey
(74) *Attorney, Agent, or Firm* — Rothwell, Figg, Ernst, Manbeck, P.C.

(57) ABSTRACT

In a heat-flux measuring method for measuring an ion flux of plasma generated in a substrate processing chamber using a heat flux, a heat-flux measuring member is exposed to the plasma and irradiated with a low coherent light. The heat-flux measuring member has a three-layered structure in which a first length and a second length of optical paths of the low-coherent light in the first layer and the third layer are measured using optical interference of reflected lights from the heat-flux measuring member. Current temperatures of the first layer and the third layer are obtained based on the measured first length, the measured second length, and data representing thermal-optical path length relationship. A heat flux flowing through the heat-flux measuring member is calculated based on the obtained temperatures, and a thickness and a thermal conductivity of the second layer.

20 Claims, 9 Drawing Sheets

FIG.11 ature of a heat-flux measuring member exposed to plasma.

HEAT-FLUX MEASURING METHOD, SUBSTRATE PROCESSING SYSTEM, AND HEAT-FLUX MEASURING MEMBER

CROSS-REFERENCE TO RELATED APPLICATIONS

This application claims priority to Japanese Patent Application No. 2013-268968, filed on Dec. 26, 2013, the entire contents of which is incorporated herein by reference.

FIELD OF THE INVENTION

The present invention relates to a heat-flux measuring member disposed in a substrate processing chamber of a plasma processing apparatus for measuring an ion flux of plasma generated in the substrate processing chamber, a heat-flux measuring method for measuring an ion flux of plasma using a heat flux, and a substrate processing system including a heat-flux measuring apparatus for measuring an ion flux of plasma using a heat flux by measuring temperature of a heat-flux measuring member exposed to plasma.

BACKGROUND OF THE INVENTION

For a plasma processing apparatus in which various types of plasma processing, such as plasma etching and plasma CVD, are carried out on a semiconductor wafer, it is important to know an ion flux which is one of parameters representing the conditions of plasma, in order to increase stability of processes for producing products or to develop processes for manufacturing products.

As a method of measuring an ion flux, there has been proposed a method including installing a probe high-frequency oscillation unit for causing an oscillation in a plasma processing chamber at an oscillation frequency different from oscillation frequencies of a plasma source power supply and a high-frequency bias power supply, and a high-frequency receiver for receiving the high-frequency wave oscillated from the probe high-frequency oscillation unit by using a surface in contact with plasma; and measuring impedance, reflectivity and transmittance, and a variation of a harmonic component for every oscillation frequency in an electric circuit including the probe high-frequency oscillation unit and the receiver (see Japanese Patent Application Publication No. 2011-014579, for example). In addition, there has been proposed a technique of measuring an ion flux in which a chip-like substrate having a total energy flux measuring unit and a residual ion measuring unit is disposed in a region where a workpiece is to be located in a vacuum treatment space, and an ion flux is measured by a current generated in the measuring units upon incidence of ions. (see Japanese Patent Application Publication No. 2010-232527, for example).

Although there have been proposed various techniques to measure an ion flux including those described above, the present invention presents a novel approach for obtaining an ion flux based on the idea that an ion flux incident on a semiconductor wafer is a type of energy and the ion flux incident on the semiconductor wafer is changed into heat, and thus the ion flux can be obtained by calculating a heat flux in the semiconductor wafer

SUMMARY OF THE INVENTION

In view of the above, the present invention provides a heat-flux measuring method for measuring an ion flux of plasma using a heat flux flowing through a heat-flux measuring member. Further, the present invention provides a substrate processing system including a heat-flux measuring apparatus for measuring an ion flux of plasma using a heat flux by measuring temperature of a heat-flux measuring member exposed to plasma. Moreover, the present invention provides a heat-flux measuring member disposed in a substrate processing chamber on behalf of a substrate in order to measure an ion flux of plasma generated in the substrate processing chamber.

In accordance with an aspect of the present invention, there is provided a heat-flux measuring method for measuring an ion flux of plasma generated in a substrate processing chamber using a heat flux, the method including, exposing a heat-flux measuring member having a structure in which a first layer, a second layer and a third layer are stacked in a thickness direction sequentially to the plasma, the second layer being made of a material different from a material of each of the first layer and the third layer; irradiating a low coherent light to the heat-flux measuring member in the thickness direction of the structure; measuring a first length of a first optical path in which the low-coherent light reciprocates in the first layer along the thickness direction, and a second length of a second optical path in which the low-coherent light reciprocates in the third layer along the thickness direction, using optical interference of reflected lights of the irradiated low-coherent light reflected from the heat-flux measuring member; providing data representing relationships between temperatures of the first layer and a lengths of an optical path in the first layer and between temperatures of the third layer and lengths of an optical path in the third layer; obtaining current temperatures of the first layer and the third layer based on the first length, the second length and the data; and calculating the heat flux flowing through the heat-flux measuring member based on the obtained temperatures, and a thickness and a thermal conductivity of the second layer.

In accordance with another aspect of the present invention, there is provided a substrate processing system including, a substrate processing chamber in which a plasma process is performed on a substrate accommodated therein; a heat-flux measuring member having a structure in which a first layer, a second layer and a third layer are stacked in a thickness direction sequentially, the second layer being made of a material different from a material of each of the first layer and the third layer, the heat-flux measuring member being disposed such that at least one of surfaces of the first layer and the third layer is exposed to plasma generated in the substrate processing chamber; and a heat-flux measuring device configured to measure an ion flux of the plasma generated in the substrate processing chamber using a heat flux, wherein the heat-flux measuring device includes an optical system configured to irradiate to the heat-flux measuring member a low-coherent light in the thickness direction of the structure and receive reflected lights of the low-coherent light reflected from the heat-flux measuring member when the low-coherent light is irradiated to the heat-flux measuring member; and an analysis unit configured to calculate the heat flux flowing through the heat-flux measuring member using optical interference of the reflected lights, and wherein the analysis unit measures a first length of a first optical path in which the low-coherent light reciprocates in the first layer along the thickness direction, and a second length of a second optical path in which the low-coherent light reciprocates in the third layer along the thickness direction, obtains current temperatures of the first layer and the third layer based on the first length, the second length and data representing relationships between temperatures of the first layer and a lengths of an optical path in the first layer and between temperatures of the third layer and lengths of an optical path in the third layer, and calculates the heat flux flowing through the heat-flux measuring member based on the obtained temperatures, and a thickness and a thermal conductivity of the second layer.

In accordance with still another aspect of the present invention, there is provided a heat-flux measuring member to be disposed in a substrate processing apparatus for generating plasma, the heat-flux measuring member including, a first layer that is low-coherent light transmittable; a second layer stacked on the first layer; and a third layer that is stacked on the second layer and low-coherent light transmittable, wherein the second layer is made of a material different from a material of each of the first layer and the third layer, and wherein the heat-flux measuring member is to be disposed in a substrate processing chamber of the substrate processing apparatus so that at least one of surfaces of the first layer and the third layer is exposed to the plasma.

According to the present invention, by measuring temperatures of the first layer and the third layer on the front surface and the rear surface, respectively, of the heat-flux measuring member having a three-layered structure, an ion flux incident on the heat-flux measuring member can be obtained using a heat flux flowing through the heat-flux measuring member. In particular, according to the present invention, a heat flux when plasma is in a steady state, which is most important in a process, can be measured. By utilizing the ion flux information thus obtained, it is possible to manage processes for the production of products by substrate processing, to increase stability of the processes and to maintain high quality of the products. In addition, the ion flux information thus obtained is useful for developing processes for plasma processing. Moreover, according to the heat-flux measuring method of the present invention, a heat flux can be measured simply, easily and accurately.

BRIEF DESCRIPTION OF THE DRAWINGS

The objects and features of the present invention will become apparent from the following description of embodiments, given in conjunction with the accompanying drawings, in which.

DETAILED DESCRIPTION OF THE PREFERRED EMBODIMENTS

A heat-flux measuring method, a substrate processing system, and a heat-flux measuring member in accordance with embodiments of the present invention will now be described with reference to the accompanying drawings.

Hereinafter, exemplary embodiments of the present invention will be described in detail with reference to the accompanying drawings. Herein, a substrate processing system will be described in which a heat-flux measuring member and a heat-flux measuring device for measuring a heat flux flowing through the heat-flux measuring member by measuring the temperature of the heat-flux measuring member according to the present invention are applied to a substrate processing apparatus that performs a plasma etching process on a semiconductor wafer (referred to hereinafter as a wafer) which is a substrate.

Figure 1:
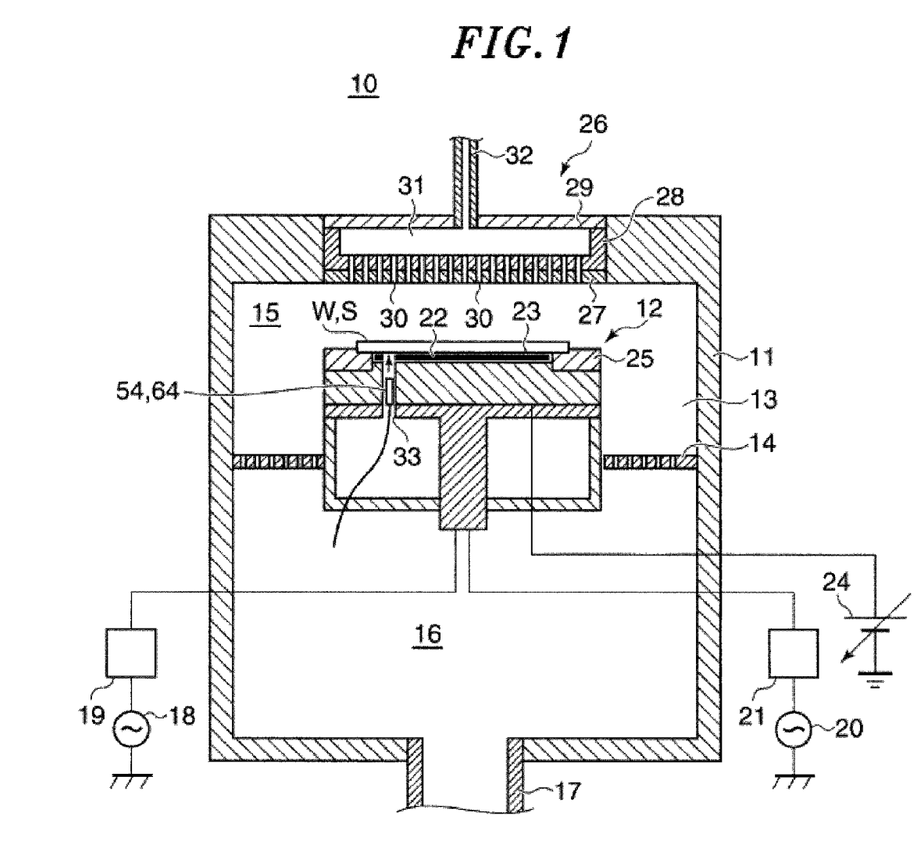
FIG. 1 is a cross-sectional view for schematically illustrating the configuration of a substrate processing apparatus employing a heat-flux measuring member and a heat-flux measuring device according to an exemplary embodiment of the present invention.

FIG. 1 is a cross-sectional view for schematically illustrating the configuration of the substrate processing apparatus employing the heat-flux measuring member and the heat-flux measuring device according to an exemplary embodiment of the present invention. The substrate processing apparatus 10 shown in FIG. 1 includes a chamber 11 where a semiconductor device wafer having a diameter of, e.g., 300 mm, is accommodated. A cylindrical susceptor (mounting table) 12 is placed on which a wafer W or a first heat-flux measuring member S to be described with reference to FIG. 2 is provided in the chamber 11. In the substrate processing apparatus 10, a side exhaust passageway 13 is formed between a side surface of the susceptor 12 and an inner wall of the chamber 11. A gas exhaust plate 14 is provided in the middle of the side exhaust passageway 13.

The gas exhaust plate 14 is a plate-shaped member having a plurality of through holes. The gas exhaust plate 14 serves as a partition plate for partitioning the inner space of the chamber 11 into an upper portion and a lower portion. As will be described later, a plasma is generated in a processing chamber 15 defined at the upper portion of the chamber 11 by the gas exhaust plate 14. A gas exhaust line 17 through which gas in the chamber 11 is discharged is connected to a gas exhaust chamber (manifold) 16 defined at the lower portion of the chamber 11 by the gas exhaust plate 14. The gas exhaust plate 14 captures or reflects the plasma generated in the processing chamber 15 to prevent leakage of the plasma to the manifold 16.

A TMP (Turbo Molecular Pump) and a DP (Dry Pump) (both not shown) are connected to the gas exhaust line 17. The chamber 11 is evacuated and depressurized by those pumps. Specifically, the DP depressurizes in the inside of the chamber 11 from the atmospheric pressure to a medium vacuum state (e.g., about $1.3 \times 10$ Pa (0.1 Torr) or less) and the TMP depressurizes the inside of the chamber 11 to a high vacuum state (e.g., about $1.3 \times 10^{-3}$ Pa ($1.0 \times 10^{-5}$ Torr) or less) in cooperation with the DP. Further, the pressure in the chamber 11 is controlled by an APC valve (not shown).

The susceptor 12 is connected to a first high frequency power supply 18 via a first matching unit 19 and also connected to a second high frequency power supply 20 via a second matching unit 21. The first high frequency power supply 18 applies a high frequency power for ion attraction which has a relatively low frequency, e.g., 2 MHz, to the susceptor 12. Meanwhile, the second high frequency power supply 20 applies a high frequency power for plasma generation which has a relatively high frequency, e.g., 60 MHz, to the susceptor 12. Accordingly, the susceptor 12 serves as an electrode. Further, the first and the second matching unit 19 and 21 maximize the efficiency of applying the high frequency power to the susceptor 12 by reducing reflection of the high frequency power from the susceptor 12.

At the upper portion of the susceptor 12, a small-diameter cylinder protrudes coaxially from a top surface of a large-diameter cylinder, so that a stepped portion is formed so as to surround the small-diameter cylinder. An electrostatic chuck 23 made of ceramic and having therein an electrostatic electrode plate 22 is provided at a top surface of the small-diameter cylinder. A DC power supply 24 is connected to the electrostatic electrode plate 22. When a positive DC voltage is applied to the electrostatic electrode plate 22, a negative potential is generated on a surface (backside) of the wafer W which faces the electrostatic chuck 23. Accordingly, a potential difference is generated between the electrostatic electrode plate 22 and the backside of the wafer W. The wafer W is attracted and held on the electrostatic chuck 23 by Coulomb force or Johnson Rahbeck force generated by the potential difference.

A focus ring 25 that is a ring-shaped member is mounted on the stepped portion formed at the upper portion of the susceptor 12 to surround the wafer W attracted and held on the electrostatic chuck 23. The focus ring 25 is made of, e.g., silicon. Since the focus ring is made of a semiconductor, the plasma distribution region is extended from a space above the wafer W to a space above the focus ring 25. Accordingly, the plasma density on the peripheral portion of the wafer W is maintained at a level substantially equal to that on the central portion of the wafer W. As a result, the plasma etching can be uniformly performed on the entire surface of the wafer W.

Figure 7:
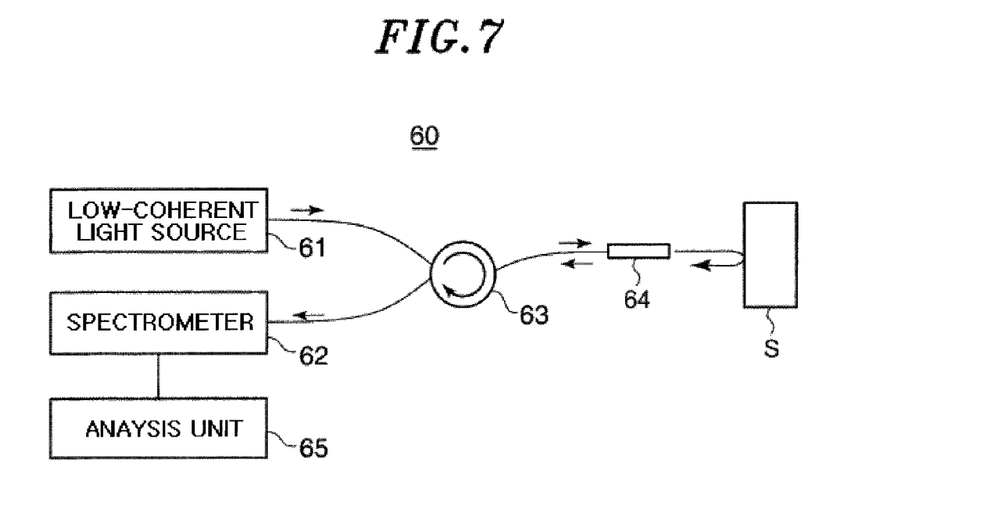
FIG. 7 is a block diagram for schematically illustrating the configuration of a second heat-flux measuring device applicable to the substrate processing apparatus of FIG. 1.

A hole portion 33 is provided such that it penetrates through the susceptor 12 and the electrostatic chuck 23 in the vertical direction. In the hole portion 33, a first collimator 54 to be described with reference to FIG. 3 or a collimator 64 to be described with reference to FIG. 7 are disposed. From these collimators, the wafer W or the first heat-flux measuring member S mounted on the electrostatic chuck 23 can be irradiated with low-coherent light.

A shower head 26 is provided at a ceiling portion of the chamber 11 so as to face the susceptor 12. The shower head 26 includes an upper electrode plate 27, a cooling plate 28 detachably holding the upper electrode 27, and a cover 29 covering the cooling plate 28. The upper electrode plate 27 is made of a semiconductor, e.g., Si, and is formed of a circular plate-shaped member having a plurality of gas holes 30 penetrating therethrough in a thickness direction thereof.

A buffer space 31 is provided in the cooling plate 28, and a processing gas inlet line 32 is connected to the buffer space 31. In the substrate processing apparatus 10, a processing gas supplied into the buffer space 31 from the processing gas inlet line 32 is introduced into the processing chamber 15 through the gas holes 30. The processing gas introduced into the processing chamber 15 is excited into plasma by the high frequency power for plasma generation which is applied from the second high frequency power supply 20 to the processing chamber 15 via the susceptor 12. Ions in the plasma are attracted toward the wafer W by the high frequency power for ion attraction which is applied from the first high frequency power supply 18 to the susceptor 12. As a consequence, the plasma etching is performed on the wafer W.

To know an ion flux of plasma which plasma etching process is performed on the wafer W is important for increasing the process stability when the wafer W is processed or for developing processes. In particular, the etching rate when the plasma is in a steady state greatly affects the process quality, and therefore it is beneficial to know the ion flux when the plasma is in a steady state. The Ion flux attracted toward the wafer W is changed into heat, and thus the ion flux can be estimated by measuring the amount of the heat supplied onto the wafer W due to the plasma.

However, since heat escapes from the wafer W via the electrostatic chuck 23, a heat flux flowing through the wafer W cannot be measured by simply measuring the temperature of the wafer W. For this reason, according to this exemplary embodiment, the first heat-flux measuring member S is used on behalf of the wafer W, and accordingly an ion flux is obtained by using a heat flux flowing through the first heat-flux measuring member S.

Figure 2A:
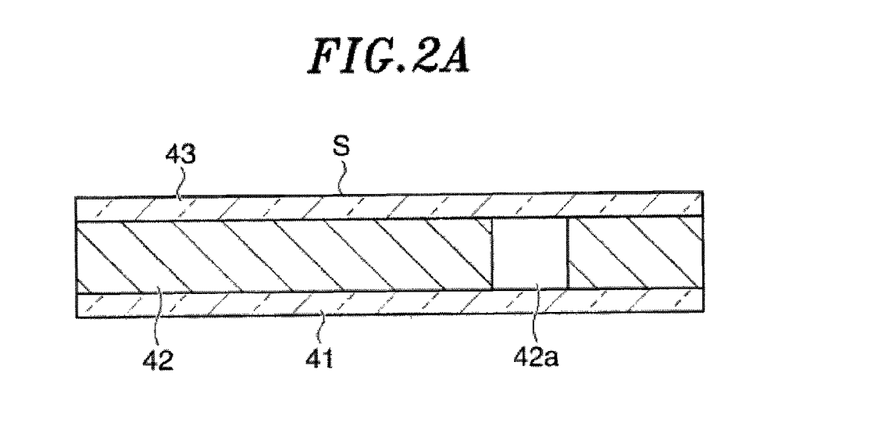
FIG. 2A is a cross-sectional view for schematically illustrating the configuration of a first heat-flux measuring member accommodated in a chamber of the substrate processing apparatus of FIG. 1.

FIG. 2A is a cross-sectional view of the first heat-flux measuring member S. The first heat-flux measuring member S is mounted on the electrostatic chuck 23 on behalf of the wafer W and is exposed to the plasma. The first heat-flux measuring member S has a plate-like shape. FIG. 2A shows a cross-section perpendicular to its front and rear surfaces. The dimensions (the shape and area of the front surface) of the first heat-flux measuring member S are preferably equal to those of the wafer W so that it is exposed to the plasma in the same conditions as the wafer W.

In a state where the first heat-flux measuring member S is mounted on the electrostatic chuck 23 and plasma is generated, and temperatures of a first layer 41 and a third layer 43 are measured to obtain the heat flux flowing through the first heat-flux measuring member S. The temperatures of the first layer 41 and the third layer 43 are obtained using optical interference of reflected lights of low-coherent light irradiated to the first heat-flux measuring member S. A specific method thereof will be described below with reference to FIGS. 3 to 7.

The first heat-flux measuring member S has a three-layered structure in which the first layer 41, a second layer 42 and the third layer 43 are stacked sequentially. At least the first layer 41 and the third layer 43 have a property to transmit therethrough the low-coherent light from the first collimator 54 or the collimator 64. In the second layer 42, a hole portion 42a penetrating through the second layer 42 in the thickness direction thereof is provided. As will be described with reference to FIG. 4, the first heat-flux measuring member S is irradiated with the low-coherent light from the first collimator 54 or the collimator 64 in the thickness direction (the direction in which the first layer 41, the second layer 42 and the third layer 43 are stacked on one another) so that it passes through the hole portion 42a. Therefore, the second layer 42 may or may not have a property to transmit therethrough the low-coherent light. The diameter Φ of the hole portion 42a may range, for example, from 1.5 mm to 3.0 mm if the irradiation aperture Φ of the low-coherent light from the first collimator 54 or the collimator 64 is 1 mm.

The first layer 41 and the third layer 43 are preferably made of a material of excellent thermal conductivity, e.g., silicon (Si). This is because it is desirable to suppress temperature gradients in the first layer 41 and the third layer 43 as much as possible, since it is assumed in measuring a heat flux flowing through the first heat-flux measuring member S that no temperature gradient in the thickness direction is made in the first layer 41 and the third layer 43, as will be described below. In order to suppress temperature gradients in the first layer 41 and the third layer 43 as much as possible, it is desirable to make the first layer 41 and the third layer 43 as thin as possible in so far as optical path differences $(2n_1d_1, 2n_3d_3)$ can be measured, which is to be described below.

Further, the second layer 42 is made of a material different from that of the first layer 41 or the third layer 43. To create differences in temperature between the first layer 41 and the second layer 42 and between the second layer 42 and the third layer 43, it is desirable that the second layer 42 is made of a material with poorer thermal conductivity (lower thermal conductivity) than that of the first layer 41 and the third layer 43. For example, the second layer 42 may be made of various types of glass or ceramic. The thickness of the second layer 42 also depends on the thermal conductivity of the material of the second layer 42, and thus the thickness of the second layer 42 can be reduced by using a material with low thermal conductivity. However, it is also possible to increase measurement accuracy by making the second layer 42 thicker to increase the differences in temperatures between the first layer 41 and the second layer 42 and between the second layer 42 and the third layer 43.

Figure 2B:
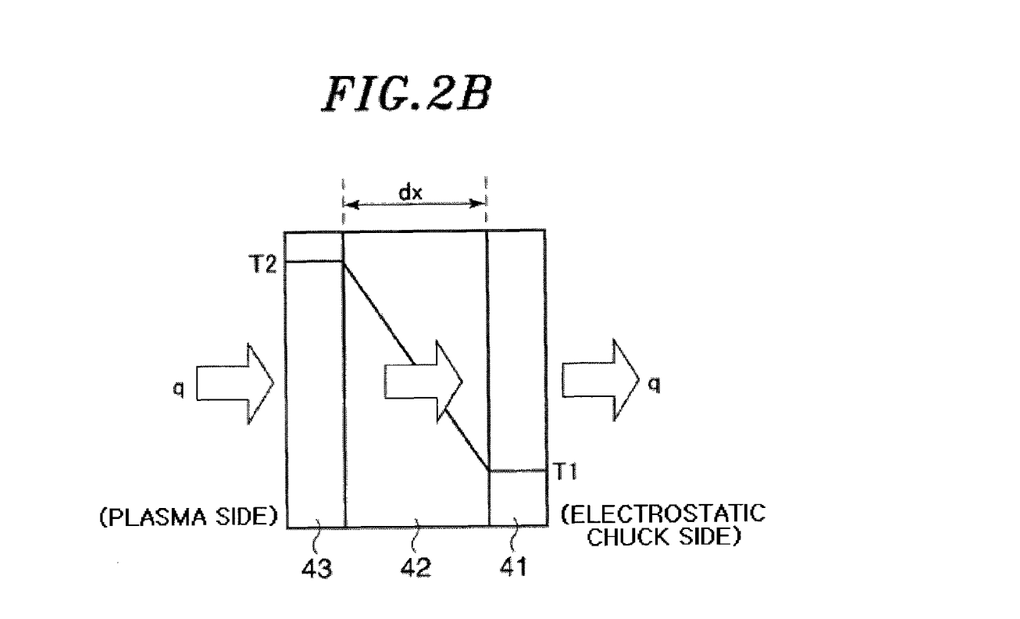
FIG. 2B is a view for schematically illustrating the principle of how to measure the heat flux flowing through the first heat-flux measuring member.

FIG. 2B is a view for schematically illustrating the principle of how to measure the heat flux flowing through the first heat-flux measuring member S. The first heat-flux measuring member S is disposed such that the third layer 43 is located on the plasma side while the first layer 41 is located on the electrostatic chuck 23 side. An ion flux of the plasma is incident on the third layer 43, and then the ion flux is changed into heat to flow from the third layer 43 to the first layer 41. A heat flux q at this time is expressed as Equation 1. In Equation 1, Q denotes the amount of heat flowing from the third layer 43 to the first layer 41. A denotes a heat transfer area in which the amount of heat Q flows, which corresponds to the area of the front surface of the first heat-flux measuring member S and is a known value.

The temperature of the third layer 43 is denoted by $T_2$, and the temperature of the first layer 41 is denoted by $T_1$, and it is assumed that no difference in temperature exists inside the third layer 43 and inside the first layer 41. Where the thermal conductivity of the material of the second layer 42 is denoted by k, and the thickness of the second layer 42 is denoted by dx, the temperature gradient dt/dx in the second layer 42 is expressed as $(T_1-T_2)/dx$. Accordingly, Equation 1 can be expressed as Equation 2. As such, by measuring the temperatures $T_1$ and $T_2$ of the first layer 41 and the third layer 43, respectively, the heat flux q can be calculated.

$$q=Q/A \qquad \text{Equation 1}$$

$$q=Q/A=-k\times dt/dx=-k\times(T_1-T_2)/dx \qquad \text{Equation 2}$$

Next, a method to measure the respective temperatures $T_1$ and $T_2$ of the first layer 41 and the third layer 43 of the first heat-flux measuring member S will be described.

A computing device (personal computer) performs various types of calculation processes by causing a CPU to execute software (program) stored in a ROM, RAM, hard disk drive or the like.

Figure 3:
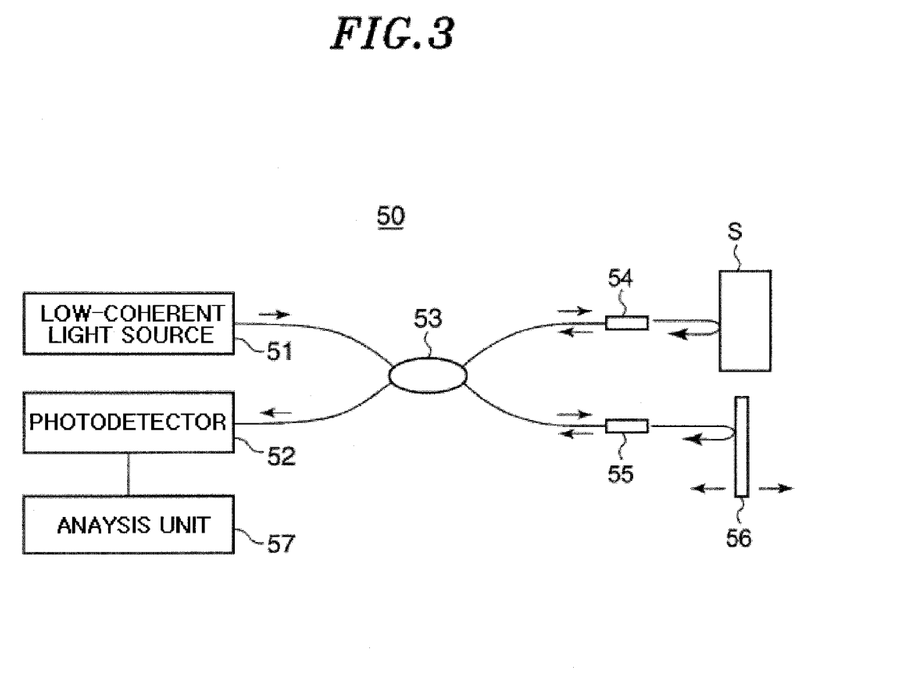
FIG. 3 is a block diagram for schematically illustrating the configuration of the first heat-flux measuring device applicable to the substrate processing apparatus of FIG. 1.

FIG. 3 is a block diagram schematically showing the configuration of the first heat-flux measuring device applicable to the substrate processing apparatus 10, for measuring a heat flux flowing through the first heat-flux measuring member S. The first heat-flux measuring device 50 is of the so-called Michelson interferometer and includes a low-coherent light source 51, a photodetector 52, a 2×2 coupler 53, a first collimator 54, a second collimator 55, a reference mirror 56, and an analysis unit 57. The components 51 to 55 constitute an optical system. The connection between the low-coherent light source 51 and the 2×2 coupler 53, the connection between the photodetector 52 and the 2×2 coupler 53, the connection between the 2×2 coupler 53 and the first collimator 54, and the connection between the 2×2 coupler 53 and the second collimator 55 are made by respective optical fiber cables.

The low-coherent light source 51 outputs low-coherent light having a wavelength to pass through the first layer 41 and the third layer 43 of the first heat-flux measuring member S. As mentioned earlier, the first layer 41 and the third layer 43 are made of silicon. Therefore, as the low-coherent light source 51, a SLD (Super Luminescent Diode) may be used that outputs low-coherent light having, for example, the center wavelength $\lambda_0$ of 1.55 µm or 1.31 µm and the coherence length of approximately 50 µm at the maximum power of 1.5 mW.

The first collimator 54 and the second collimator 55 each output low-coherent light aligned as parallel light beams. The first collimator 54 irradiates the first heat-flux measuring member S with first low-coherent light of the low-coherent light from the low-coherent light source 51 to receive reflected lights. The second collimator 55 irradiates the reference mirror 56 with second low-coherent light of the low-coherent light from the low-coherent light source 51 to receive another reflected light. The reflected lights and the other reflected light received by the first collimator 54 and the second collimator 55, respectively, are transferred to the 2×2 coupler 53.

The 2×2 coupler 53 splits the low-coherent light output from the low-coherent light source 51 into the first low-coherent light and the second low-coherent light traveling in two optical paths and transfers the first low-coherent light traveling in one of the optical paths to the first collimator 54 and the second low-coherent light traveling in the other of the optical paths to the second collimator 55. In addition, the 2×2 coupler 53 receives the reflected lights from the first heat-flux measuring member S irradiated with the first low-coherent light from the first collimator 54 and the other reflected light from the reference mirror 56 irradiated with the second low-coherent light from the second collimator 55, to then transfer the reflected lights to the photodetector 52.

The reference mirror 56 is movable by a driving mechanism (not shown) in the direction parallel to the irradiation direction of the second low-coherent light from the second collimator 55 irradiates with. The movement of the reference mirror 56 is controlled by the analysis unit 57.

The photodetector 52 is, for example, a germanium (Ge) photodiode and outputs an interference wave of the received, reflected lights to the analysis unit 57. The interference wave output from the photodetector 52 to the analysis unit is output in the form of an analog electrical signal. Therefore, the analysis unit 57 includes an A/D converter to convert an analog signal output from the photodetector 52 into a digital signal, and a computing device, such as a personal computer, to calculate the length of an optical path from the interference waveform data received from the A/D converter to calculate a temperature from the calculated length of the optical path.

Figure 4:
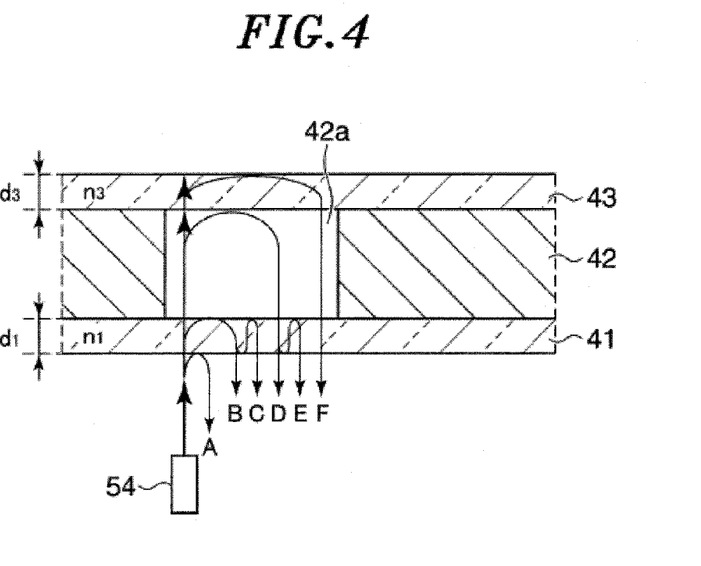
FIG. 4 is a diagram for illustrating reflected light obtained when the first heat-flux measuring member of FIG. 2 is irradiated with low-coherent light.

FIG. 4 is a diagram for illustrating reflected lights obtained when the first heat-flux measuring member S is irradiated with the first low-coherent light from the first collimator 54. When the first layer 41 of the first heat-flux measuring member S is irradiated with the first low-coherent light from the first collimator 54 in the thickness direction of the first heat-flux measuring member S, a part of the first low-coherent light is reflected at the outer surface of the first layer 41, so that reflected light A is incident on the first collimator 54 to then proceed to the 2×2 coupler 53. A part of the first low-coherent light incident on the first layer 41 is reflected at the surface of the first layer 41 facing the second layer 42 (referred to hereinafter as "inner surface," the surface of the third layer 43 facing the second layer 42 is also referred as "inner surface"), so that reflected light B is incident on the first collimator 54 to then proceed to the 2×2 coupler 53. In addition, a part of the first low-coherent light reflected at the inner surface of the first layer 41 is reflected at the outer surface of the first layer 41 to be then reflected at the inner surface of the first layer 41 again, so that reflected light C is incident on the first collimator 54 to then proceed to the 2×2 coupler 53.

A part of the first low-coherent light incident on the hole portion 42a formed in the second layer 42 is reflected at the inner surface of the third layer 43, so that reflected light D is incident on the first collimator 54 to then proceed to the 2×2 coupler 53. In addition, a part of the first low-coherent light reflected at the inner surface of the third layer 43 is reflected at the outer surface of the first layer 41 to be then reflected at the inner surface of the first layer 41 again, so that reflected light E is incident on the first collimator 54 to then proceed to the 2×2 coupler 53.

A part of the first low-coherent light incident on the third layer 43 is reflected at the outer surface of the third layer 43, so that reflected light F is incident on the first collimator 54 to then proceed to the 2×2 coupler 53. Although there are other reflected lights than the reflected lights A to F, they are not described because the reflective temperatures $T_1$ and $T_2$ of the first layer 41 and the third layer 43 can be measured with the reflected lights A to F (at least three reflected lights D to F).

Where the thickness and the refractive index of the first layer 41 are denoted by $d_1$ and $n_1$, respectively, and the thickness and the reflective index of the third layer 43 are denoted by $d_3$ and $n_3$, respectively, the optical path difference between the reflected lights A and B, the optical path difference between the reflected lights B and C, and the optical path difference between the reflected lights D and E, for example, are each expressed as $2 \times n_1 \times d_1$ (hereinafter expressed as $2n_1 d_1$), and the optical path difference between the reflected lights D and F are expressed as $2 \times n_3 \times d_3$ (hereinafter expressed as $2n_3 d_3$). In other words, the optical path difference $2n_1 d_1$ represents the length of the optical path in which the low-coherent light reciprocates in the first layer 41 in the thickness direction, and the optical path difference $2n_3 d_3$ represents the length of the optical path in which low-coherent light reciprocates in the third layer 43 in the thickness direction. For this reason, the optical path differences $2n_1 d_1$ and $2n_3 d_3$ are measured using the first heat-flux measuring device 50.

Figure 5:
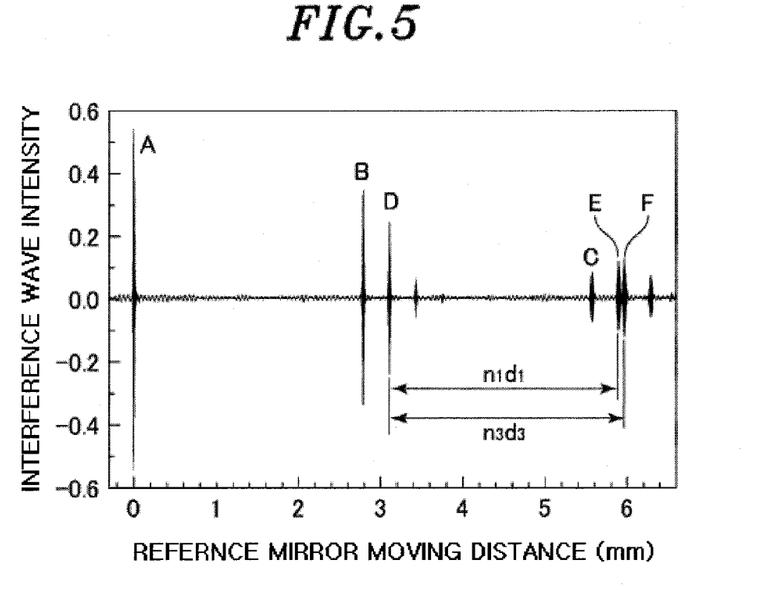
FIG. 5 is a diagram for illustrating an example of interference waveforms when the reflected lights shown in FIG. 4 are obtained using the first heat-flux measuring device of FIG. 3.

FIG. 5 is a diagram for illustrating an example of interference waveforms when the reflected lights shown in FIG. 4 are obtained using the first heat-flux measuring device 50. The reflected lights A to F and the reflected light from the reference mirror 56 exhibit strong interference when the reference mirror 56 is located at a particular position, i.e., when the length of the optical path of each of the reflected lights A to F coincides with the length of the optical path of the reflected light from the reference mirror 56. In FIG. 5, the symbol A indicates a strong interference wave created by the interference between the reflected light A and the reflected light from the reference mirror 56, and so do the symbols B to F. Additionally, in FIG. 5, the distance between the peak of the reflected light D and the peak of the reflected light E, for example, is $n_1 d_1$ which is the half the value of the optical path difference $2n_1 d_1$. Accordingly, as the reference mirror 56 is moved while receiving the reflected lights from the first heat-flux measuring member S, positions where strong interference waves appear with respect to the moving distance of the reference mirror 56 can be obtained. By doing so, the values $n_1 d_1$ and $n_3 d_3$ which is half of the value of the optical path differences $2n_1 d_1$ and $2n_3 d_3$ can be measured.

Meanwhile, the thicknesses of the first layer 41 and the third layer 43 change with temperature depending on the thermal expansion coefficients of the materials of the first layer 41 and the third layer 43, respectively. Accordingly, the optical path differences $2n_1 d_1$ and $2n_3 d_3$ also change with temperature. For this reason, the data is prepared by measuring the relationship between the optical path difference $2n_1 d_1$ and $2n_3 d_3$ of reflected lights of low-coherent light in the first heat-flux measuring member S and the temperature of the first heat-flux measuring member S, with a blackbody furnace, for example. The data is stored in a ROM, non-volatile RAM or a hard disk drive included in the analysis unit 57 in advance.

Figure 6:
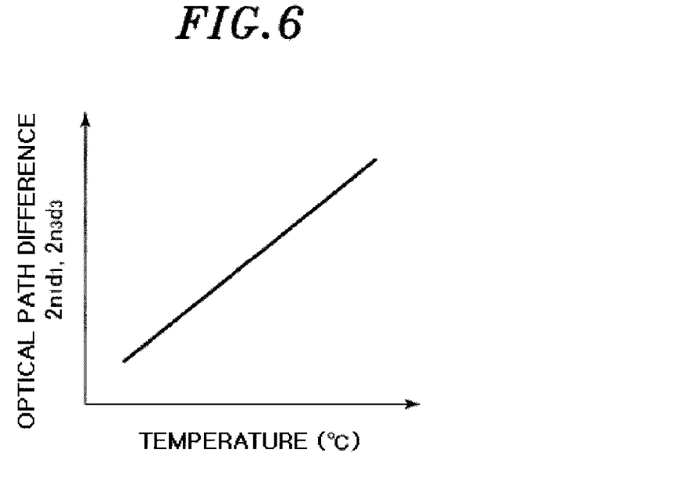
FIG. 6 is a graph for illustrating an example of data representing the relationship between the optical path differences of the reflected lights shown in FIG. 4 and the temperature of the first heat-flux measuring member.

FIG. 6 is a graph for illustrating an example of prepared data. In this example, the first layer 41 and the third layer 43 are made of the same material, and the thickness $d_1$ of the first layer 41 and the thickness $d_3$ of the third layer 43 are equal to each other. If the first layer 41 and the third layer 43 are made of different materials or if the thickness $d_1$ of the first layer 41 and the thickness of the third layer 43 are different from each other, the data may be prepared for each of the first layer 41 and the third layer 43. Such data is also used for a second heat-flux measuring device 60, a third heat-flux measuring device 70, and a fourth heat-flux measuring device 80.

The interference waveforms shown in FIG. 5 are obtained by moving the reference mirror 56 while obtaining the reflected lights A to F, with the first heat-flux measuring member S mounted on the electrostatic chuck 23 and the plasma generated under the same condition as when the plasma processing is actually carried out on the wafer W.

Then, based on the obtained interference waveforms, the optical path differences $2n_1d_1$ and $2n_3d_3$ of the first layer 41 and the third layer 43, respectively, of the first heat-flux measuring member S during the plasma processing are obtained. Then, the temperatures $T_1$ and $T_2$ of the first layer 41 and the third layer 43, respectively, are calculated from the obtained optical path differences $2n_1d_1$ and $2n_3d_3$ and the data of FIG. 6. From the temperatures $T_1$ and $T_2$ thus calculated, the above Equation 2 and the thickness dx of the second layer 42 (the thickness at the room temperature), a heat flux q flowing through the first heat-flux measuring member S can be calculated as an ion flux. In addition, since the heat transfer area A is already known, the amount of heat Q can also be calculated according to the above Equation 1.

In addition, the thickness dx of the second layer 42 also changes with temperature depending on the thermal expansion coefficient of the material of the second layer 42. Therefore, in order to calculate the heat flux q more accurately, rather than using the thickness of the second layer 42 at the room temperature, the thickness dx of the second layer 42 may be used. The thickness dx of the second layer can be calculated by calculating the optical path difference ($2 \times n_2 \times dx$) between the reflected lights B and D shown in FIG. 5, where $n_2$ denotes the refractive index of the hole portion 42a of the second layer 42 (i.e., the refractive index of the air) to calculate the thickness dx from the optical path difference. In this instance, it may be assumed that the refractive index $n_2$ is independent of temperature and is constant. On the contrary, the thickness of the second layer 42 when the temperatures of the first layer 41 and the third layer 43 are $T_1$ and $T_2$, respectively, may be calculated from the thickness of the second layer 42 at the room temperature and the thermal expansion coefficient of the material of the second layer 42, and then it may be substituted into the above Equation 2.

FIG. 7 is a block diagram schematically showing the configuration of a second heat-flux measuring device applicable to the substrate processing apparatus 10, for measuring a heat flux flowing through the first heat-flux measuring member S. The second heat-flux measuring device 60 includes a low-coherent light source 61, a spectrometer 62, an optical circulator 63, a collimator 64, and an analysis unit 65. The components 61 to 64 constitute an optical system. The connection between the low-coherent light source 61 and the optical circulator 63, the connection between the spectrometer 62 and the optical circulator 63, and the connection between the optical circulator 63 and the collimator 64 are made by respective optical fiber cables.

The low-coherent light source 61 is identical to the low-coherent light source 51 of the first heat-flux measuring device 50. The optical circulator 63 transfers the low-coherent light output from the low-coherent light source 61 to the collimator 64 and also transfers reflected lights from the first heat-flux measuring member S via the collimator 64 to the analysis unit 65. The collimator 64 has the same functions as those of the first collimator 54 of the first heat-flux measuring device 50. The reflected lights from the first heat-flux measuring member S received by the collimator 64 is the same as that already described above with respect to FIG. 4.

The spectrometer 62, roughly speaking, includes a light-dispersing element and a light-receiving element. The light-dispersing element disperses the reflected lights transferred via the optical fiber cable at a specific angle for each of the wavelengths. As an example of the light-dispersing element, a diffraction grating may be used. The light-receiving element receives the reflected lights dispersed by the light-dispersing element to detect the spectrum of the received, reflected lights (intensity vs. wavenumber). Specifically, CCDs arranged in a grid pattern may be employed as the light-receiving element.

As described above, since the light-receiving element is composed of photoelectric conversion devices such as CCDs, the reflected light spectrum output from the spectrometer 62 to the analysis unit 65 is output in the form of an analog electric signal. Therefore, the analysis unit 65 includes an A/D converter to convert an analog signal output from the spectrometer 62 into a digital signal, and a computing device, such as a personal computer, to perform a Fourier transform on a digital signal indicative of the spectrum of the reflected lights received from the A/D converter to calculate the length of an optical path in order to calculate the temperature based on the calculated length of the optical path.

The reflected lights A to F shown in FIG. 4 can also be obtained when the first heat-flux measuring member S is irradiated with the low-coherent light from the collimator of the second heat-flux measuring device 60. In the second heat-flux measuring device 60, the reflected lights A to F are separated by the spectrometer 62 into a reflection number spectrum dependent on wavenumber, for example, and then the Fourier transform is performed on the obtained reflection number spectrum. In this regard, the Fourier transform refers to a process to transform a function of wavenumber (or frequency or wavelength) variable into a function of distance variable. By performing the Fourier transform, peaks each representing respective reflected lights A to F are indicated on the distance axis, and the distance between the peak of the reflected light D and the peak of the reflected light E becomes the optical path difference $2n_1d_1$, and the distance between the peak of the reflected light D and the peak of the reflected light F becomes the optical path difference $2n_3d_3$. From such optical path differences $2n_1d_1$ and $2n_3d_3$ and the data of FIG. 6, the respective temperatures $T_1$ and $T_2$ of the first layer 41 and the third layer 43 can be calculated.

Additionally, when the second heat-flux measuring device 60 is used, a difference between the optical path difference $2n_1d_1$ which is the length of the optical path of the low-coherent light in the first layer 41 and the optical path difference $2n_3d_3$ which is the length of the optical path of the low-coherent light in the third layer 43 needs to be longer than the coherence length of the low-coherent light from the low-coherent light source 61. This is because the wave of the reflected light associated with the first layer 41 overlaps that of the reflected light of the third layer 43 when the optical path lengths are the same, so that they cannot be separated.

Next, referring to FIGS. 8A to 10B, a second heat-flux measuring member S1 which is a modification of the first heat-flux measuring member S, and a third heat-flux measuring device 70 and a fourth heat-flux measuring device 80 for measuring a heat flux q flowing the second heat-flux measuring member S1 will be described.

Figure 8A:
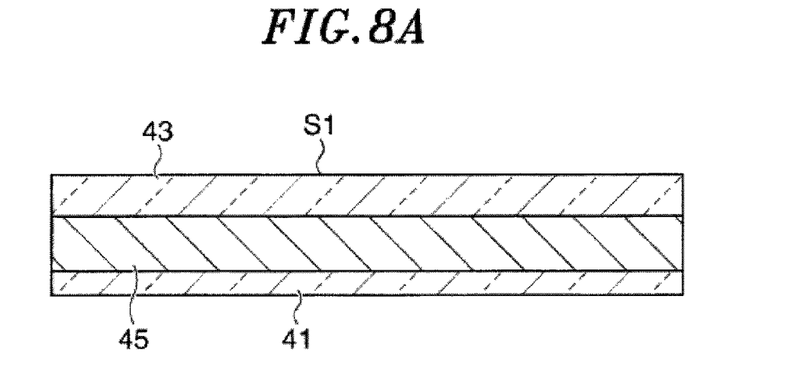
FIG. 8A is a cross-sectional view for schematically illustrating the configuration of the second heat-flux measuring member accommodated in the chamber of the substrate processing apparatus of FIG. 1.

FIG. 8A is a schematic cross-sectional view of the second heat-flux measuring member S1. The second heat-flux measuring member S1 has a three-layered structure in which a first layer 41, a second layer 45 and a third layer 43 are stacked on one another in this order. The first layer 41 and the third layer 43 are identical to the first layer 41 and the third layer 43 of the first heat-flux measuring member S; and, therefore, descriptions thereon will be omitted.

The second layer 45 is made of a material having a property not to transmit therethrough the low-coherent light with which the second heat-flux measuring member S is irradiated. For example, the second layer 45 may be made of a sintered body of various types of ceramic, such as an alumina sintered body.

Figure 8B:
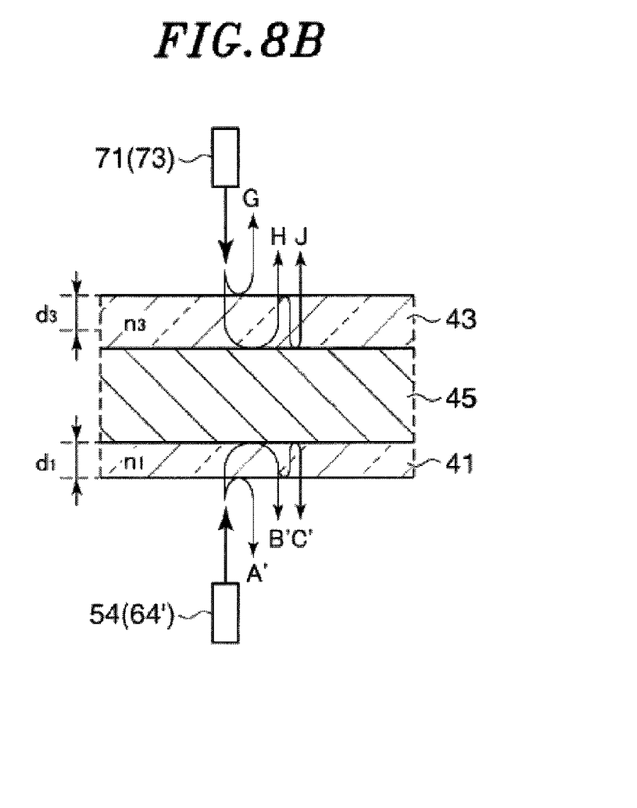
FIG. 8B is a view for illustrating reflected lights obtained when the second heat-flux measuring member is irradiated with low-coherent light.

FIG. 8B is a diagram for illustrating reflected lights obtained when the second heat-flux measuring member S1 is irradiated with the low-coherent light. Since the second layer 45 does not allow the low-coherent light to pass therethrough, for the second heat-flux measuring member S1, a first collimator 54 is disposed that irradiates the first layer 41 with low-coherent light on the first layer 41 side and receives reflected lights, and a third collimator 71 is disposed that irradiates the third layer 43 with low-coherent light on the third layer 43 side and receives reflected lights. The third collimator 71 is one of the collimators included in a third heat-flux measuring device to be described with reference to FIG. 9A and is identical to the first collimator 54.

When the first layer 41 of the second heat-flux measuring member S1 is irradiated with the low-coherent light from the first collimator 54 in the thickness direction of the second heat-flux measuring member S1, a part of the low-coherent light from the first collimator 54 is reflected at the outer surface of the first layer 41, so that reflected light A' is incident on the first collimator 54. A part of the low-coherent light from the first collimator 54 incident on the first layer 41 is reflected at the interface between the first layer 41 and the second layer 45, so that reflected light B' is incident on the first collimator 54. In addition, a part of the low-coherent light from the first collimator 54 reflected at the interface between the first layer 41 and the second layer 45 is reflected at the outer surface of the first layer 41 to be then reflected at the interface of the first layer 41 and the second layer 45 again, so that reflected light C' is incident on the first collimator 54.

Likewise, when the third layer 43 of the second heat-flux measuring member S1 is irradiated with the low-coherent light from the third collimator 71 in the thickness direction of the second heat-flux measuring member S1, a part of the low-coherent light from the third collimator 71 is reflected at the outer surface of the third layer 43, so that reflected light G is incident on the third collimator 71. A part of the low-coherent light from the third collimator 71 on the third layer 43 is reflected at the interface between the third layer 43 and the second layer 45, so that reflected light H is incident on the third collimator 71. In addition, a part of the low-coherent light from the third collimator 71 reflected at the interface between the third layer 43 and the second layer 45 is reflected at the outer surface of the third layer 43 to be then reflected at the interface between the third layer 43 and the second layer 45 again, so that reflected light J is incident on the third collimator 71.

Figure 9A:
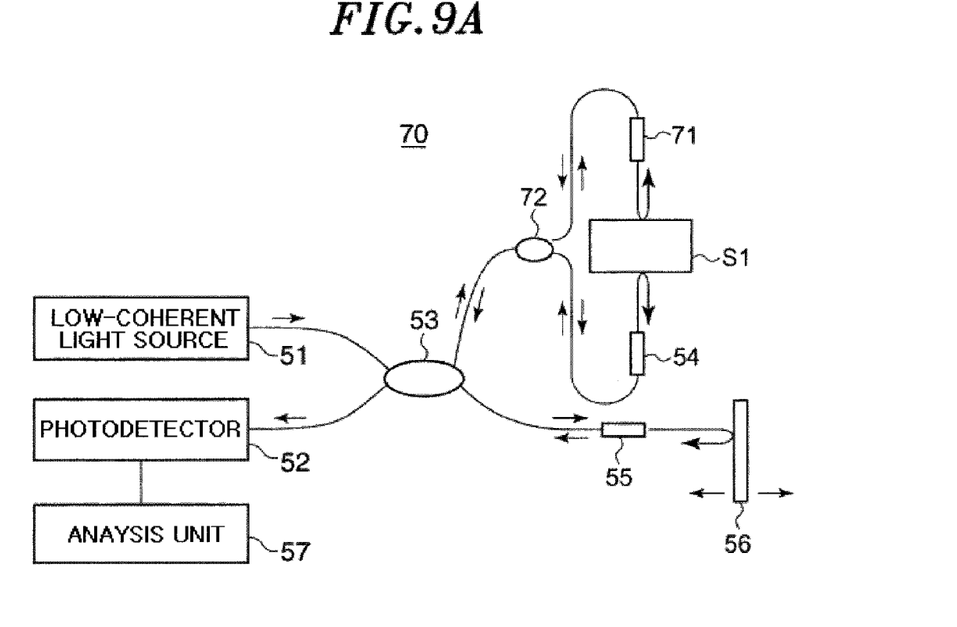
FIG. 9A is a block diagram of a third heat-flux measuring device applicable to the substrate processing apparatus for measuring a heat flux flowing through the second heat-flux measuring member of FIG. 8A.

FIG. 9A is a block diagram schematically showing the configuration of the third heat-flux measuring device 70 applicable to the substrate processing apparatus 10, for measuring a heat flux flowing through the second heat-flux measuring member S1. The third heat-flux measuring device 70 is a modification of the first heat-flux measuring device 50 such that it can irradiate the second heat-flux measuring member S1 with the first low-coherent light of the low-coherent light from the low-coherent light source 51. Accordingly, the like reference numerals are used to designate like elements with the first heat-flux measuring device 50 (the low-coherent light source 51, the photodetector 52, the 2×2 coupler 53, the first collimator 54, the second collimator 55, the reference mirror 56, and the analysis unit 57), and descriptions thereon will be omitted.

In the third heat-flux measuring device 70, a splitter 72 is connected to one of the outputs of the 2×2 coupler 53, and the first low-coherent light from the 2×2 coupler 53 is split into third low-coherent light and fourth low-coherent light traveling in two paths at the splitter 72 to be transferred to the first collimator 54 and the third collimator 71, respectively. The components 51 to 55, 71 and 72 constitute an optical system. As described above with respect to FIG. 8B, each of the first collimator 54 and the third collimator 71 irradiates the second heat-flux measuring member S1 with the third low-coherent light and the fourth low-coherent light, respectively, and receives reflected lights. The reflected lights received by the first collimator 54 and the third collimator 71, respectively, are transferred to the photodetector 52 via the splitter 72 and the 2×2 coupler 53.

Additionally, it is necessary to dispose the third collimator 71 at a position so as not to be exposed to the plasma. Accordingly, for example, in the substrate processing apparatus 10, a hole portion is provided in an upper electrode plate 27 so that the third collimator 71 is accommodated in the hole portion to irradiate the third layer 43 of the second heat-flux measuring member S1 mounted on the electrostatic chuck 23 with the fourth low-coherent light.

Figure 9B:
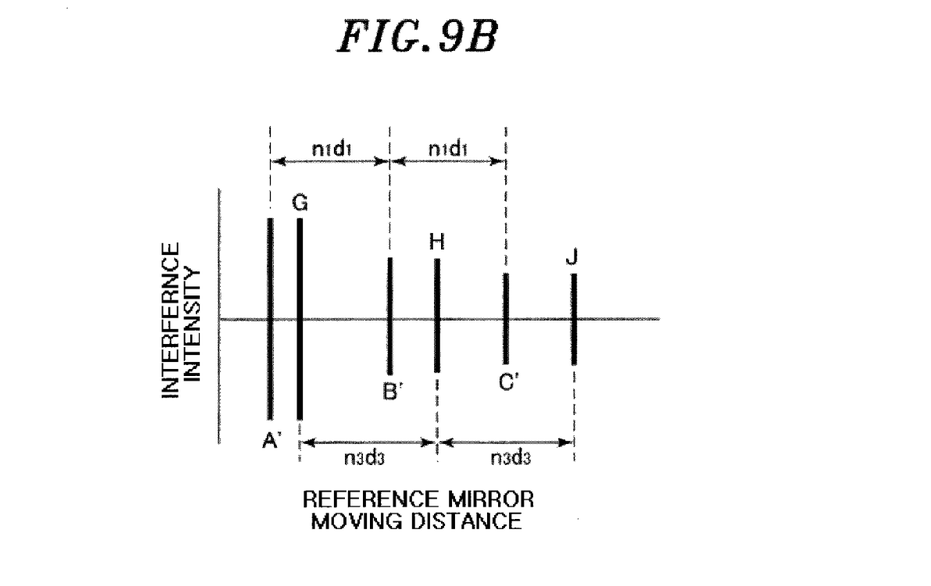
FIG. 9B is a view for schematically illustrating an example of interference waveforms when the reflected lights shown in FIG. 8B are obtained using the third heat-flux measuring device.

FIG. 9B is a diagram for illustrating an example of interference waves when the reflected lights shown in FIG. 8B are obtained using the third heat-flux measuring device 70. The method to analyze the reflected lights for the third heat-flux measuring device 70 is identical to that of the first heat-flux measuring device 50; and, therefore, descriptions thereon will be omitted.

FIG. 9B shows an example in which the first layer 41 and the third layer 43 are made of the same material but the thickness $d_3$ is greater than the thickness $d_1$. The distance between the peak of the reflected light A' and the peak of the reflected light B' and the distance between the peak of the reflected light B' and the peak of the reflected light C' become $n_1 d_1$ which is half of the value of the optical path difference $2n_1 d_1$. Likewise, the distance between the peak of the reflected light G and the peak of the reflected light H and the distance between the peak of the reflected light H and the peak of the reflected light J become $n_3 d_3$ which is half of the value of the optical path difference $2n_3 d_3$. Therefore, based on the obtained optical path differences $2n_1 d_1$ and $2n_3 d_3$ using the third heat-flux measuring device 70, and the data of FIG. 6, the respective temperatures $T_1$ and $T_2$ of the first layer 41 and the third layer 43 can be obtained (the data is prepared for each of the optical path differences $2n_1 d_1$ and $2n_3 d_3$ because the thicknesses $d_1$ and $d_3$ of the first layer 41 and the third layer 43 are different from each other in this instance). Based on the obtained temperatures $T_1$ and $T_2$, the above Equation 2 and the thickness dx of the second layer 45, the heat flux q flowing through the second heat-flux measuring member S1 can be calculated as an ion flux.

Figure 10A:
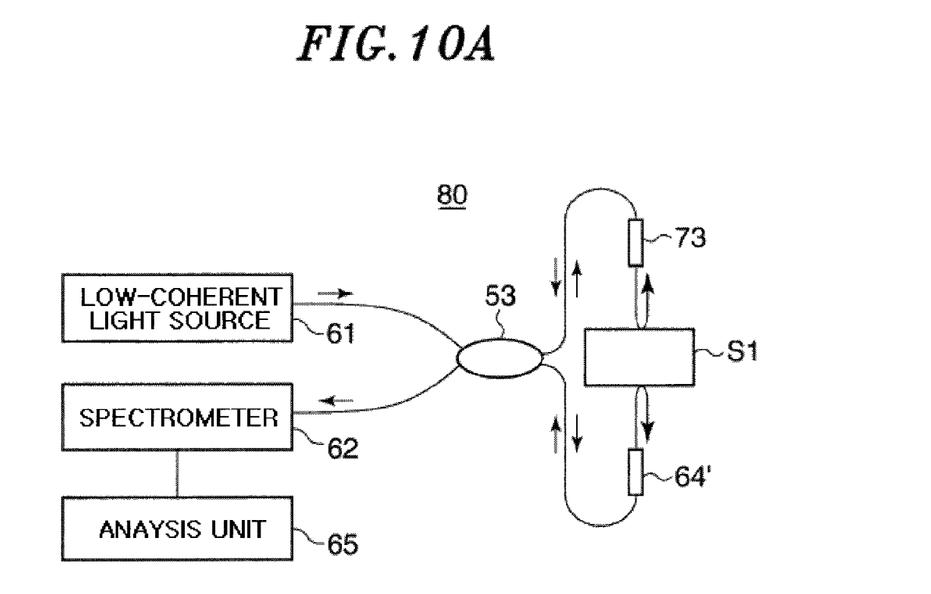
FIG. 10A is a block diagram of a fourth heat-flux measuring device applicable to the substrate processing apparatus for measuring a heat flux flowing through the second heat-flux measuring member of FIG. 8A.

FIG. 10A is a block diagram schematically showing the configuration of the fourth heat-flux measuring device 80 applicable to the substrate processing apparatus 10, for measuring a heat flux flowing through the second heat-flux measuring member S1. The fourth heat-flux measuring device 80 is a modification of the second heat-flux measuring device 60 such that it can irradiate the second heat-flux measuring member S1 with low-coherent light. Accordingly, the like reference numerals are used to designate like elements with the second heat-flux measuring device 60 (the low-coherent light source 61, the spectrometer 62, and the analysis unit 65), and descriptions thereon will be omitted.

In the fourth heat-flux measuring device 80, the low-coherent light output from the low-coherent light source 61 is input to the 2×2 coupler 53 (identical to that of the first heat-flux measuring device 50), and the 2×2 coupler 53 outputs the received low-coherent light to the first collimator 64' and the second collimator 73. The components 53, 61, 62, 64' and constitute an optical system. Further, the first collimator 64' is identical to the collimator 64 included in the second heat-flux measuring device 60, and the second collimator 73 is identical to the third collimator 71 included in the third heat-flux measuring device 70.

As described above with respect to FIG. 8B, each of the first collimator 64' and the second collimator 73 irradiates the second heat-flux measuring member S1 with low-coherent light from the low-coherent light source 61 and receives reflected lights. The reflected lights received by the first collimator 64' and the second collimator 73, respectively, are transferred to the spectrometer 62 via the 2×2 coupler 53.

Figure 10B:
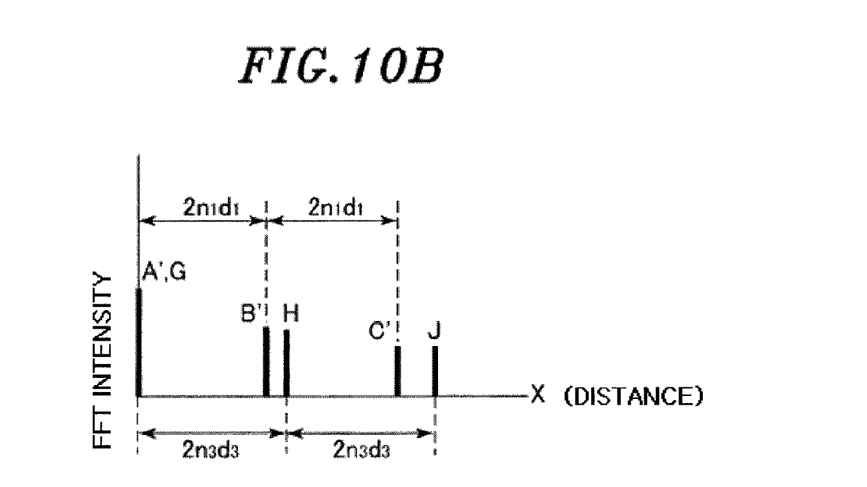
FIG. 10B is a view for schematically illustrating an example of a spectrum when the reflected lights shown in FIG. 8B are obtained using the fourth heat-flux measuring device and a Fourier transform is performed thereon.

FIG. 10B is a graph for illustrating an example of a spectrum when the reflected lights shown in FIG. 8B are obtained using the fourth heat-flux measuring device 80 and are subjected to the Fourier transform. The method to analyze the reflected lights for the fourth heat-flux measuring device 80 is identical to that of the second heat-flux measuring device 60; and, therefore, descriptions thereon will be omitted.

By performing the Fourier transform, peaks each corresponding to one of the reflected lights A', B', C', G, H and J with respect to distance x are shown. The distance between the peak of the reflected light A' and the peak of the reflected light B' and the distance between the peak of the reflected light B' and the peak of the reflected light C' indicate the optical path difference $2n_1d_1$. Likewise, the distance between the peak of the reflected light G and the peak of the reflected light H and the distance between the peak of the reflected light H and the peak of the reflected light J indicate the optical path difference $2n_3d_3$. Therefore, based on the obtained optical path differences $2n_1d_1$ and $2n_3d_3$ using the fourth heat-flux measuring device 80, and the data of FIG. 6, the respective temperatures $T_1$ and $T_2$ of the first layer 41 and the third layer 43 can be obtained (the data is prepared for each of the optical path differences $2n_1d_1$ and $2n_3d_3$ because the thicknesses $d_1$ and $d_3$ of the first layer 41 and the third layer 43 are different from each other). Based on the obtained temperatures $T_1$ and $T_2$, the above Equation 2 and the thickness dx of the second layer 45, the heat flux q flowing through the second heat-flux measuring member S1 can be calculated as an ion flux.

Figure 11:
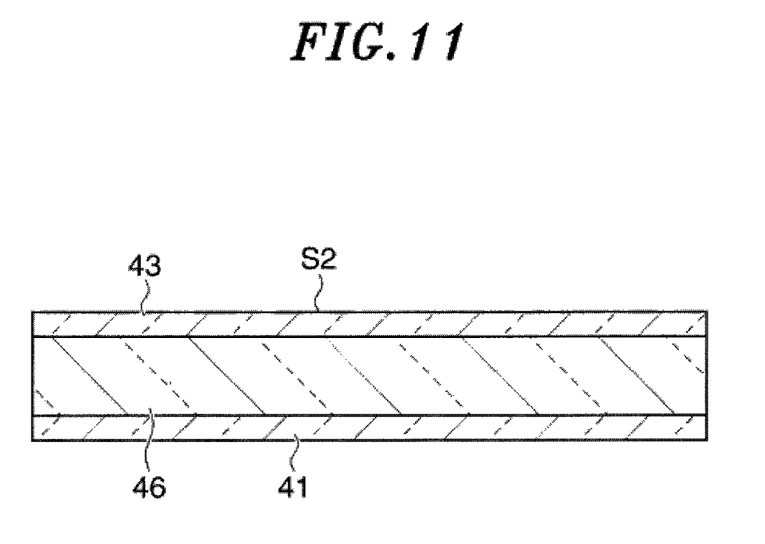
FIG. 11 is a cross-sectional view of a third heat-flux measuring member accommodated in the chamber of the substrate processing apparatus of FIG. 1.

Next, referring to FIG. 11, a third heat-flux measuring member S2 which is a modification of the first heat-flux measuring member S will be described. FIG. 11 is a schematic cross-sectional view of the third heat-flux measuring member S2. The third heat-flux measuring member S has a three-layered structure in which a first layer 41, a second layer 46 and a third layer 43 are stacked sequentially. The first layer 41 and the third layer 43 are identical to the first layer 41 and the third layer 43 of the first heat-flux measuring member S; and, therefore, descriptions thereon will be omitted.

The second layer 46 has a property to transmit therethrough low-coherent light with which the third heat-flux measuring member S2 is irradiated. The second layer 46 is made of a material different from that of the first layer and the third layer 43, such as $SiO_2$ based glass or (single crystal) sapphire.

The third heat-flux measuring member S2 is used in the same manner as the first heat-flux measuring member S. In measuring the heat flux q flowing through the third heat-flux measuring member S2, the first heat-flux measuring device 50 or the second heat-flux measuring device 60 is used. That is, in the third heat-flux measuring member S2, the second layer 46 allows low-coherent light to pass therethrough, and thus the same reflected lights as those described above with respect to FIG. 4 are obtained by irradiating the third heat-flux measuring member S2 with low-coherent light in the thickness direction. Then, by analyzing the obtained, reflected lights, the optical path differences $2n_1d_1$ and $2n_3d_3$ can be measured. Therefore, based on the measured optical path differences $2n_1d_1$ and $2n_3d_3$ and the data of FIG. 6, the respective temperatures $T_1$ and $T_2$ of the first layer 41 and the third layer 43 can be calculated. Then, based on the calculated temperatures $T_1$ and $T_2$, the above Equation 2 and the thickness dx of the second layer 46, the heat flux q flowing through the second heat-flux measuring member S1 can be calculated as an ion flux.

Thus far, although exemplary embodiments of the present invention have been described, the present invention is not limited to the above exemplary embodiments. For example, in the above-described exemplary embodiments, the surface of the third layer 43 of the first heat-flux measuring member S is exposed to plasma. However, the first heat-flux measuring member S may be mounted on the electrostatic chuck 23 so that the surface of the first layer 41 is exposed to plasma.

Further, in the above-described exemplary embodiments, although the first heat-flux measuring member S is mounted on the electrostatic chuck 23, the present invention is not limited thereto. The first heat-flux measuring member S may be mounted on the wafer W mounted on the electrostatic chuck 23, and, by generating plasma, the heat flux q flowing through the first heat-flux measuring member S may be measured. In this instance, measured interference waveforms become more complicated since the reflected lights from the front and rear surfaces of the wafer W are added. However, the respective temperatures $T_1$ and $T_2$ of the first layer 41 and the third layer 43 can still be measured by obtaining, from the interference waveforms, waveforms indicative of the optical path differences $2n_1d_1$ and $2n_3d_3$ of the first layer and the third layer 43 (or $n_1d_1$ and $n_3d_3$ which is half thereof). Also, in this instance, it is necessary to employ a technique to facilitate heat transfer at the interface between the first heat-flux measuring member S and the wafer W.

The method of measuring a heat flux according to the exemplary embodiments of the present invention is not limited to plasma etching. The method can be applied to substrate processing apparatuses to perform various processes using plasma, such as film formation on a wafer by plasma CVD. The substrate processing apparatus is not limited to the apparatuses to perform plasma processing on a wafer. For example, the substrate processing apparatus may be apparatuses to perform a process on other substrates than a wafer, such as a glass substrate or a photomask for FPD (flat panel display), a CD substrate, and a print substrate.

While the invention has been shown and described with respect to the embodiments, it will be understood by those skilled in the art that various changes and modifications may be made without departing from the scope of the invention as defined in the following claims.

What is claimed is:

1. A heat-flux measuring method for measuring an ion flux of plasma generated in a substrate processing chamber using a heat flux, the method comprising:

providing a heat-flux measuring member comprising:
a first layer that is low-coherent light transmittable;
a second layer stacked on the first layer; and
a third layer that is stacked on the second layer and low-coherent light transmittable,
wherein the second layer is made of a material different from a material of each of the first layer and the third layer;
exposing the heat-flux measuring member;
irradiating a low coherent light to the heat-flux measuring member in a thickness direction of the heat-flux measuring member;
measuring a first length of a first optical path in which the low-coherent light reciprocates in the first layer along the thickness direction, and a second length of a second optical path in which the low-coherent light reciprocates in the third layer along the thickness direction, using optical interference of reflected lights of the irradiated low-coherent light reflected from the heat-flux measuring member;
providing data representing relationships between temperatures of the first layer and lengths of an optical path in the first layer and between temperatures of the third layer and lengths of an optical path in the third layer;
obtaining current temperatures of the first layer and the third layer based on the first length, the second length and the data; and
calculating the heat flux flowing through the heat-flux measuring member based on the obtained temperatures, and a thickness and a thermal conductivity of the second layer.

2. The heat-flux measuring method of claim 1, wherein a difference between the first length and the second length is larger than a coherence length of the low-coherent light from a light source.

3. The heat-flux measuring method of claim 1, wherein a thickness of each of the first layer and the third layer is smaller than that of the second layer.

4. The heat-flux measuring method of claim 1, wherein a thermal conductivity of the material of each of the first layer and the third layer is larger than that of the material of the second layer.

5. The heat-flux measuring method of claim 1,
wherein a basic low-coherent light output from a light source is split into a first low-coherent light and a second low-coherent light, the first low-coherent light being the low-coherent light, and
wherein the measuring of the first length and the second length includes measuring the first length and the second length, based on an interference light of the reflected lights and another reflected light reflected from a reference mirror when the second low-coherent light is irradiated onto the reference mirror while the reference mirror is moved in a direction parallel to an incident direction of the second low-coherent light, and further based on a moving distance of the reference mirror.

6. The heat-flux measuring method of claim 5,
wherein the second layer is made of the material that does not transmit the low-coherent light therethrough,
wherein the first low-coherent light is split into a third low-coherent light and a fourth low-coherent light, and
wherein the measuring of the first length and the second length includes irradiating to the first layer the third low-coherent light and irradiating to the third layer the fourth low-coherent light.

7. The heat-flux measuring method of claim 1, wherein the measuring of the first length and the second length includes measuring the first length and the second length by performing a Fourier transform on a spectrum of the reflected lights.

8. The heat-flux measuring method of claim 7,
wherein the second layer of the heat-flux measuring member is made of the material that does not transmit the low-coherent light therethrough,
wherein the low-coherent light output from a light source is split into a first low-coherent light and a second low-coherent light, and
wherein the measuring of the first length and the second length includes irradiating to the first layer the first low-coherent light and irradiating to the third layer the second low-coherent light.

9. The heat-flux measuring method of claim 7,
wherein a hole portion is provided in the second layer, and
wherein the measuring of the first length and the second length includes irradiating to the heat-flux measuring member the low-coherent light so that the low-coherent light passes through the hole portion.

10. The heat-flux measuring method of claim 1, wherein the first layer and the third layer are made of silicon.

11. A substrate processing system comprising:
a substrate processing chamber in which a plasma process is performed on a substrate accommodated therein;
a heat-flux measuring member comprising:
a first layer that is low-coherent light transmittable;
a second layer stacked on the first layer; and
a third layer that is stacked on the second layer and low-coherent light transmittable,
wherein the second layer is made of a material different from a material of each of the first layer and the third layer, and wherein the heat-flux measuring member is disposed such that at least one of surface of the first layer and the third layer is exposed to plasma generated in the substrate processing chamber; and
a heat-flux measuring device configured to measure an ion flux of the plasma generated in the substrate processing chamber using a heat flux,
wherein the heat-flux measuring device includes:
an optical system configured to irradiate to the heat-flux measuring member a low-coherent light in a thickness direction of the heat-flux measuring member and receive reflected lights of the low-coherent light reflected from the heat-flux measuring member when the low-coherent light is irradiated to the heat-flux measuring member; and
an analysis unit configured to calculate the heat flux flowing through the heat-flux measuring member using optical interference of the reflected lights, and
wherein the analysis unit measures a first length of a first optical path in which the low-coherent light reciprocates in the first layer along the thickness direction, and a second length of a second optical path in which the low-coherent light reciprocates in the third layer along the thickness direction, obtains current temperatures of the first layer and the third layer based on the first length, the second length and data representing relationships between temperatures of the first layer and lengths of an optical path in the first layer and between temperatures of the third layer and lengths of an optical path in the third layer, and calculates the heat flux flowing through the heat-flux measuring member based on the obtained temperatures, and a thickness and a thermal conductivity of the second layer.

12. The substrate processing system of claim 11, wherein a difference between the first length and the second length is larger than a coherence length of the low-coherent light from the optical system.

13. The substrate processing system of claim 11, wherein a thickness of each of the first layer and the third layer of the heat-flux measuring member is smaller than that of the second layer.

14. The substrate processing system of claim 11, wherein a thermal conductivity of each of the first layer and the third layer is larger than that of the second layer.

15. The substrate processing system of claim 11,
wherein the optical system allows a basic low-coherent light to split into a first low-coherent light and a second low-coherent light, the first low-coherent light being the low-coherent light, and obtains an interference light of the reflected lights and another reflected light reflected from a reference mirror when the second low-coherent light is irradiated onto the reference mirror while the reference mirror is moved in a direction parallel to an incident direction of the second low-coherent light, and
wherein the analysis unit measures the first length and the second length based on the obtained interference light and a moving distance of the reference mirror.

16. The substrate processing system of claim 15,
wherein the second layer is made of the material that does not transmit the low-coherent light therethrough, and
wherein the optical system allows the first low-coherent light to split into a third low-coherent light and a forth low-coherent light, and irradiates to the first layer the third low-coherent light and irradiates to the third layer the forth low-coherent light.

17. The substrate processing system of claim 11,
wherein the analysis unit measures the first length and the second length by performing a Fourier transform on a spectrum of the reflected lights.

18. The substrate processing system of claim 17,
wherein the second layer of the heat-flux measuring member is made of the material that does not transmit the low-coherent light therethrough, and
wherein the optical system allows the low-coherent light to split into a first low-coherent light and a second low-coherent light, and irradiates to the first layer the first low-coherent light and irradiates to the third layer the second low-coherent light.

19. The substrate processing system of claim 17,
wherein a hole portion is provided in the second layer, and
wherein the optical system irradiates to the heat-flux measuring member the low-coherent light so that the low-coherent light passes through the hole portion.

20. The substrate processing system of claim 11, wherein the first layer and the third layer are made of silicon.

* * * * *